(12) United States Patent
Yoshida

(10) Patent No.: US 9,609,191 B2
(45) Date of Patent: Mar. 28, 2017

(54) IMAGE PICKUP UNIT AND METHOD FOR MANUFACTURING THE SAME

(71) Applicant: OLYMPUS CORPORATION, Tokyo (JP)

(72) Inventor: Kazuhiro Yoshida, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 314 days.

(21) Appl. No.: 14/289,820

(22) Filed: May 29, 2014

(65) Prior Publication Data

US 2014/0267893 A1    Sep. 18, 2014

Related U.S. Application Data

(63) Continuation of application No. PCT/JP2012/072880, filed on Sep. 7, 2012.

(30) Foreign Application Priority Data

Dec. 1, 2011    (JP) ................................. 2011-263764

(51) Int. Cl.
H04N 5/225    (2006.01)
H01L 27/146   (2006.01)
G02B 7/02     (2006.01)

(52) U.S. Cl.
CPC ........... *H04N 5/2254* (2013.01); *G02B 7/021* (2013.01); *G02B 7/023* (2013.01);
(Continued)

(58) Field of Classification Search
CPC .... H04N 5/369; H04N 5/2253; H04N 5/2254; H04N 5/2257; H01L 27/14601;
(Continued)

(56) References Cited

U.S. PATENT DOCUMENTS

2005/0041134 A1*   2/2005   Takayama ............ G02B 3/0075
                                                      348/340
2005/0110889 A1    5/2005   Tuttle et al.
(Continued)

FOREIGN PATENT DOCUMENTS

EP    2124431 A2    11/2009
EP    2479978 A1     7/2012
(Continued)

OTHER PUBLICATIONS

Machine English Translation JP 2009-080166 A (Apr. 16, 2009).*
(Continued)

*Primary Examiner* — Nelson D. Hernández Hernández
(74) *Attorney, Agent, or Firm* — Scully, Scott, Murphy & Presser, PC

(57) ABSTRACT

An image pickup unit according to the embodiment includes an image pickup device chip having a rectangular shape in plan view, a transparent substrate which is equal in plan view dimensions to the image pickup device chip and is joined to the image pickup device chip, and a lens unit joined to the transparent substrate with the center of a light receiving portion of the image pickup chip aligned with the optical axis, in which, two locking portions are formed in the transparent substrate and two locked portions of the lens unit which is equal to or smaller than the image pickup device chip in plan view dimensions are fitted into or abut on the corresponding locking portions respectively.

16 Claims, 13 Drawing Sheets

(52) U.S. Cl.
CPC ..... *H01L 27/14618* (2013.01); *H04N 5/2257* (2013.01); *H01L 2924/0002* (2013.01); *Y10T 29/49002* (2015.01)

(58) Field of Classification Search
CPC ...... H01L 27/14618; H01L 2924/0002; G02B 7/021; G02B 7/023
See application file for complete search history.

(56) References Cited

U.S. PATENT DOCUMENTS

| | | |
|---|---|---|
| 2006/0264703 A1 | 11/2006 | Fujimori |
| 2009/0085138 A1 | 4/2009 | Ryu et al. |
| 2009/0278978 A1 | 11/2009 | Suzuki |
| 2010/0118157 A1 | 5/2010 | Ushijima et al. |

FOREIGN PATENT DOCUMENTS

| | | |
|---|---|---|
| JP | 2003-043327 A | 2/2003 |
| JP | 2008-166939 A | 7/2008 |
| JP | 2009-80166 A | 4/2009 |
| JP | 2009-271405 A | 11/2009 |
| JP | 2009-284260 A | 12/2009 |
| JP | 2010-114731 A | 5/2010 |

OTHER PUBLICATIONS

Extended Supplementary European Search Report dated May 29, 2015 from related European Application No. 12 85 2938.5.
International Search Report dated Dec. 18, 2012 issued in PCT/JP2012/072880.

\* cited by examiner

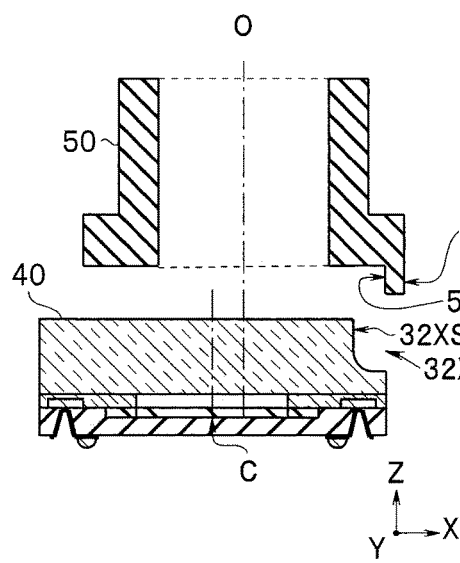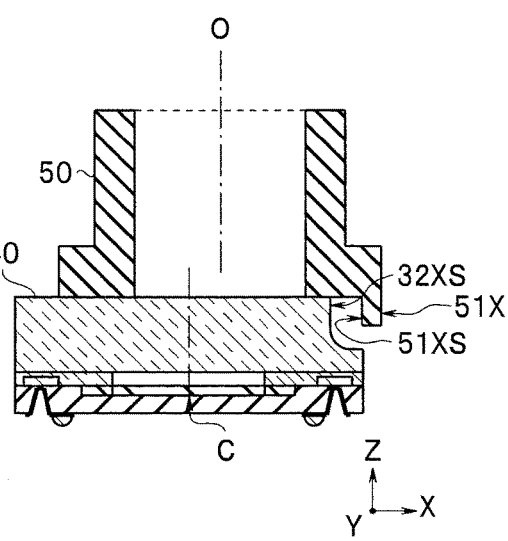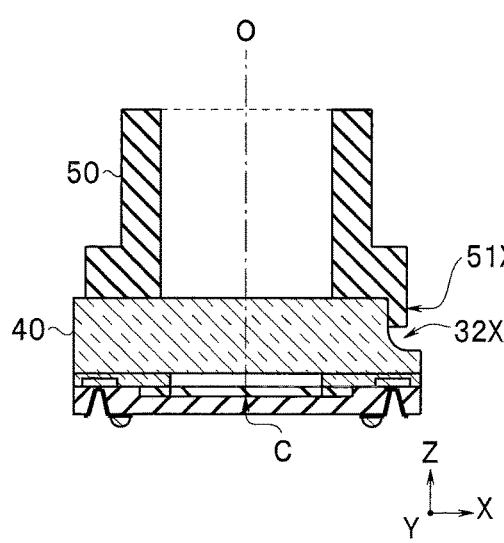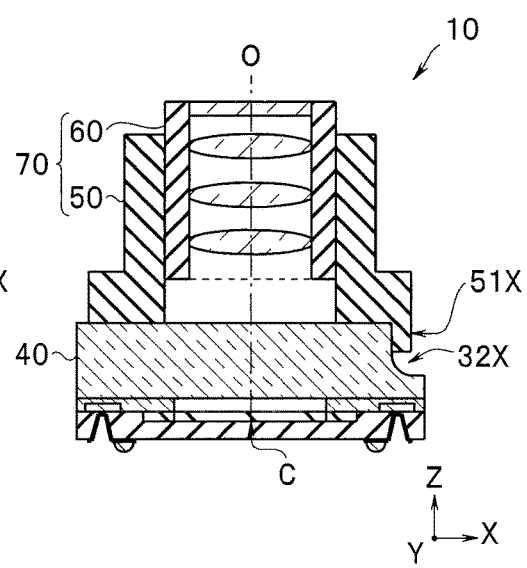

IMAGE PICKUP UNIT AND METHOD FOR MANUFACTURING THE SAME

CROSS REFERENCE TO RELATED APPLICATION

This application is a continuation application of PCT/JP2012/072880 filed on Sep. 7, 2012 and claims benefit of Japanese Application No. 2011-263764 filed in Japan on Dec. 1, 2011, the entire contents of which are incorporated herein by this reference.

BACKGROUND OF INVENTION

1. Field of the Invention

The present invention relates to an image pickup unit provided with a lens unit and a chip-size-package image pickup chip and a method for manufacturing the image pickup unit.

2. Description of the Related Art

A chip size package (CSP) technique has been known in which a large number of semiconductor chips small in plan view dimensions are collectively produced by cutting and segmenting a semiconductor wafer in which a large number of semiconductor devices are formed on a first principal plane and external electrodes connected with each of the semiconductor devices via through wirings are formed on a second principal plane.

If an image pickup device such as a CCD is formed as a semiconductor device, the semiconductor chip is segmented after a glass wafer is joined to the first principal plane to allow producing the chip-size-package image pickup chip which is an image pickup device chip to which a transparent substrate is joined.

FIG. 1 is an exploded cross section view of an image pickup unit 110 disclosed in Japanese Patent Application Laid-Open Publication No. 2008-166939. The image pickup unit 110 includes an image pickup chip 140 in which a transparent substrate 130 is joined to an image pickup device chip 120 and a lens unit 170 composed of a lens barrel (an inner cylinder portion) 160 having an optical system (a lens) and an outer barrel (an outer cylinder portion) 150.

A center C of a light receiving portion 121 of the image pickup device chip 120 needs to be accurately aligned with an optical axis O of the optical system. In the image pickup unit 110, the optical system of the lens unit 170 is aligned with the image pickup device chip 120 such that the inner surface on the lower part of the outer barrel (a lens barrel) 150 is arranged to cover four sides of the image pickup chip 140 with no space therebetween.

That is, the image pickup unit 110 includes the image pickup device chip 120 having a rectangular shape in plan view, the transparent substrate 130 that is joined to the image pickup device chip 120 and equal in plan view dimensions to the image pickup device chip 120, and the lens unit 170 joined to the transparent substrate 130 with the center of the light receiving portion of the image pickup chip 140 aligned with the optical axis O.

SUMMARY OF THE INVENTION

An image pickup unit according to an embodiment includes an image pickup device chip having a rectangular shape in plan view, a transparent substrate which is equal in plan view dimensions to the image pickup device chip and is joined to the image pickup device chip, and a lens unit joined to the transparent substrate so that an optical axis of the lens unit is aligned with a center of a light receiving portion of the image pickup chip, in which, one or two locking portions are formed in the transparent substrate, and one or two locked portions of the lens unit which is equal to or smaller than the image pickup device chip in plan view dimensions are fitted into or abut on the corresponding locking portions.

A method for manufacturing an image pickup unit according to another embodiment includes the steps of producing an image pickup device wafer on which a plurality of image pickup devices is formed, producing a junction wafer by joining a transparent wafer to the image pickup device wafer, forming one or two locking portions which are in a predetermined positional relationship with each of the image pickup devices in the transparent wafer of the junction wafer, cutting the junction wafer to be segmented into a plurality of image pickup chips, and joining a lens unit which is equal to or smaller than the image pickup chip in plan view dimensions to the image pickup chip with one or two locked portions of the lens unit fitted into or abutting on the corresponding locking portions of the image pickup chip.

BRIEF DESCRIPTION OF THE DRAWINGS

FIG. 9A is a partial cross section view for describing a method for manufacturing the image pickup unit according to the first embodiment;

FIG. 9B is a partial cross section view for describing the method for manufacturing the image pickup unit according to the first embodiment;

FIG. 9C is a partial cross section view for describing the method for manufacturing the image pickup unit according to the first embodiment;

FIG. 9D is a partial cross section view for describing the method for manufacturing the image pickup unit according to the first embodiment;

DETAILED DESCRIPTION OF THE PREFERRED EMBODIMENT(S)

<First Embodiment>

Figure 1:
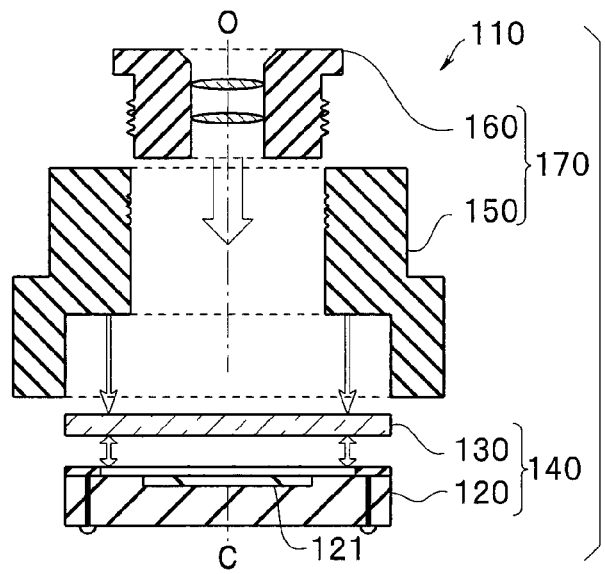
FIG. 1 is an exploded cross section view of a conventional image pickup unit.
Figure 2:
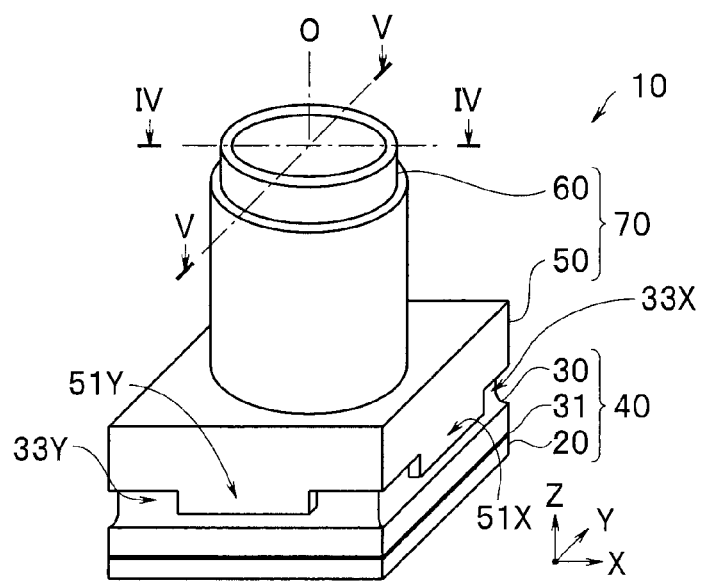
FIG. 2 is a perspective view of an image pickup unit according to a first embodiment.

An image pickup unit 10 according to the first embodiment of the present invention is described using FIGS. 2 to 5. Note that each of the following figures is a schematic view and differs in the dimensional ratios and the like of each component. A vertical direction refers to the Z axis direction. A vertical face refers to a face perpendicular to the XY plane. An upper face refers to a face in the direction of an object. A lower face (a bottom face) refers to a face in the direction of a light receiving portion 21. The plan view dimensions refer to dimensions projected onto the XY plane perpendicular to the optical axis O.

As shown in FIGS. 2 to 5, the image pickup unit 10 includes an image pickup device chip 20 having a rectangular shape in plan view, a transparent substrate 30 that is joined to the image pickup device chip 20 and equal in plan view dimensions to the image pickup device chip 20, and a lens unit 70 joined to the transparent substrate 30 via an adhesion layer (not shown) with the center C of a light receiving portion 21 of the image pickup chip 40 aligned with the optical axis O. The image pickup device chip 20 and the transparent substrate 30 are produced as an image pickup chip 40 in which both of them are joined together via an adhesion layer 31 by a WL-CSP (wafer level chip size package) technique.

The image pickup device chip 20 is made of a semiconductor such as silicon. The light receiving portion 21 made of an image pickup device, a peripheral circuit portion 23, and a plurality of electrode pads 24 is formed on a first principal plane 20SA. Note that the periphery of the light receiving portion 21 in a substantially rectangular shape is parallel to the X axis or the Y axis.

On the other hand, a plurality of external electrode portions 25 each connected with each of the electrode pads 24 by way of a through wiring 26 is formed on a second principal plane 20SB.

A color filter and a micro lens array, which are not shown, are provided on the light receiving portion 21. The peripheral circuit portion 23 is a driving/a signal processing circuit with a shift register, an output amplifier, an AD converter, a memory circuit, and the like. Each of the plurality of electrode pads 24 formed on the peripheral portion of the image pickup device chip 20 is electrically connected with the peripheral circuit portion 23 by wires (not shown) on the upper face. Through-holes passing through the image pickup device chip 20 are formed under the electrode pads 24. The through wirings 26 connected with the external electrode portions 25 of the second principal plane 20SB are formed inside the through-holes.

The transparent substrate 30 composed of transparent materials such as a general industrial optical glass, silica glass, and resin not only functions to protect the light receiving portion 21, but also functions as a tabular member for supporting the thinly processed image pickup device chip 20 and preventing the image pickup device chip 20 from being deformed and broken. The adhesion layer 31 formed in an area excluding the light receiving portion 21 is composed of an ultraviolet curing resin, for example.

A locking portion 33X having a locking face 33XS being a vertical face is formed at one of a peripheral surface of two sides crossing at right angles on the upper face of the transparent substrate 30 and a locking portion 33Y having a locking face 33YS is formed at the other thereof.

A lens unit 70 is composed of an inner cylinder portion 60 with an optical system and an outer cylinder portion 50 in which a hollow portion being circular in cross section is formed and the inner cylinder portion 60 is inserted into the hollow portion. The optical system in the inner cylinder portion 60 is composed of a plurality of lenses 62 and a cover glass 61.

A locked portion 51X having a locked face 51XS being a vertical face exists at one of a peripheral surface of two sides crossing at right angles on the bottom face of the outer cylinder portion 50 of the lens unit 70 and a locked portion 51Y having a locked face 51YS being a vertical face exists at the other thereof. The lens unit 70 is joined to the transparent substrate 30 with the locked face 51XS and the locked face 51YS abutting on the locking face 33XS and locking face 33YS to which the locked face 51XS and the locked face 51YS correspond respectively.

The locking faces 33XS and 33Y exist on the upper face of the transparent substrate 30 and the locked faces 51XS and 51YS exist on the lower face of the lens unit 70. In the image pickup unit 10, the locking face 33XS abuts on the locked face 51XS and the locking face 33YS abuts on the locked face 51YS, to thereby align the optical axis O of the lens unit 70 with the center C of the light receiving portion 21 of the image pickup chip 40, that is, to align the X direction with the Y direction.

As described above, in the image pickup unit 10 in which the locking face of the transparent substrate 30 abuts on the locked face of the lens unit 70, the plan view dimensions of the lens unit 70 are equal to or smaller than those of the transparent substrate 30. That is, the plan view dimensions of the image pickup unit 10 are equal to or smaller than those of the image pickup chip 40, so that it is suitable for the image pickup unit 10 to be provided on a site of an apparatus for which reduction in diameter is required, on the distal end portion of an endoscope, for example.

Figure 3:
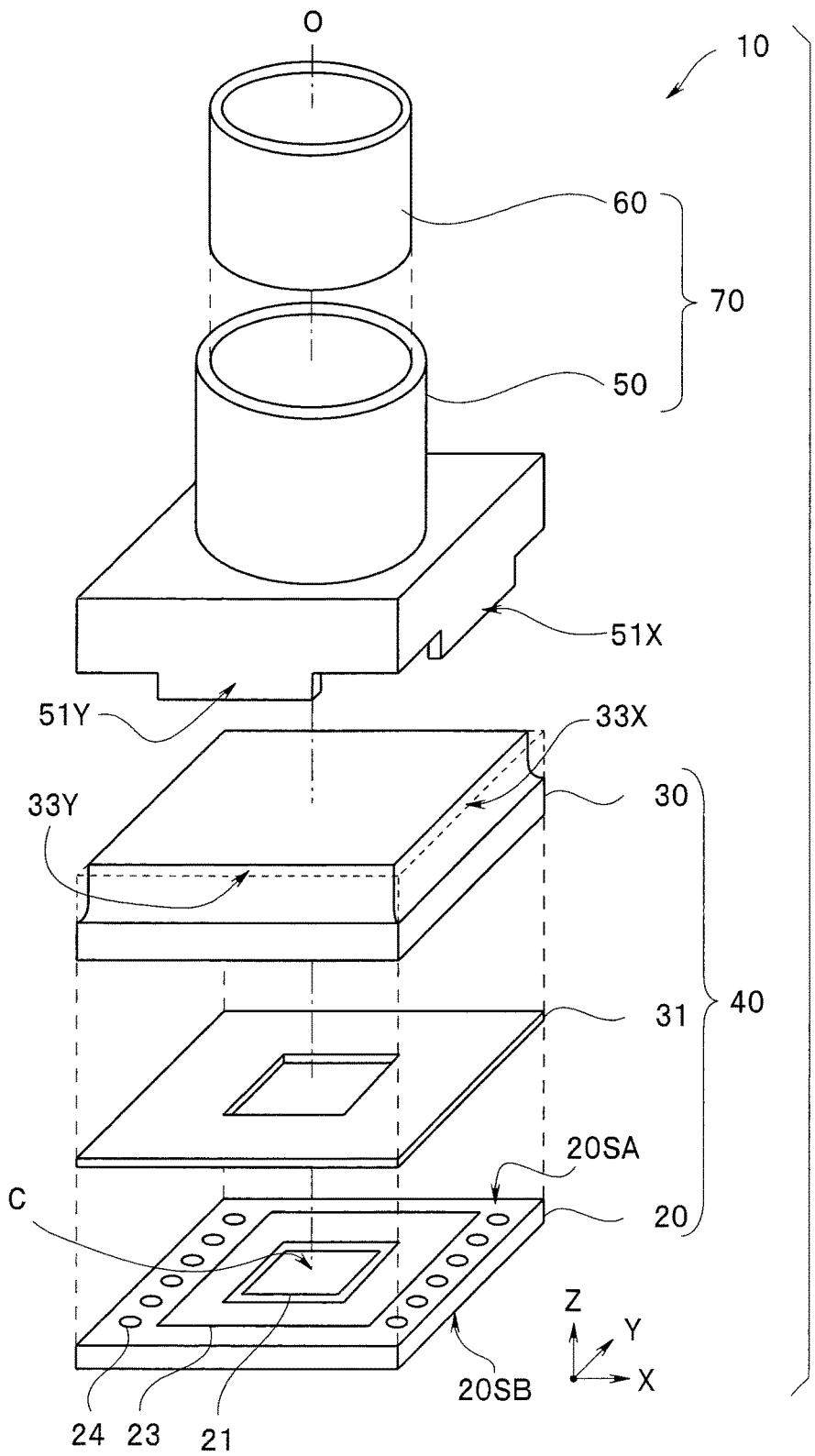
FIG. 3 is an exploded perspective view of the image pickup unit according to the first embodiment.
Figure 4:
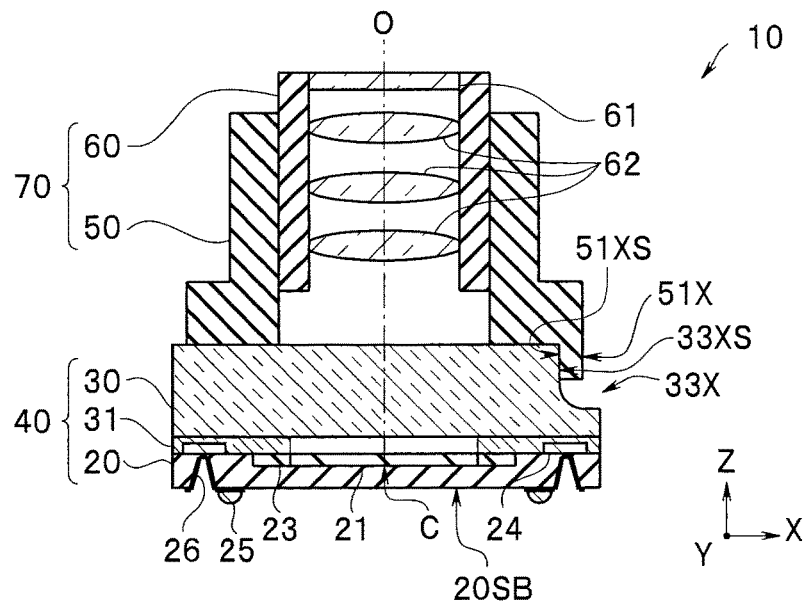
FIG. 4 is a cross section view along the line IV-IV in FIG. 2 in the image pickup unit according to the first embodiment.
Figure 5:
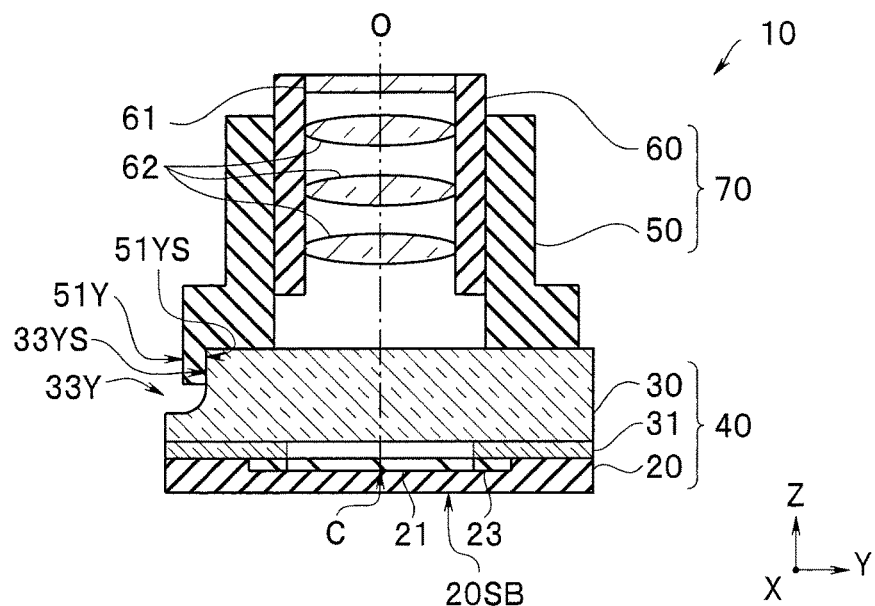
FIG. 5 is a cross section view along the line V-V in FIG. 2 in the image pickup unit according to the first embodiment.

Note that in FIG. 3 and the like, the peripheral circuit portion 23 is formed in the vicinity in the X and Y directions of the light receiving portion 21 of the image pickup device chip 20 and the plurality of electrode pads 24 is formed in both of the peripheral portions in the X-axis direction. For this reason, the center C of the light receiving portion 21 substantially corresponds to the center of the image pickup device chip 20. However, for example, in a case where the plurality of electrode pads 24 is provided only in any one of the peripheral portion sides of the image pickup device chip 20, the center C of the light receiving portion 21 does not correspond to the center of the image pickup device chip 20.

Figure 7:
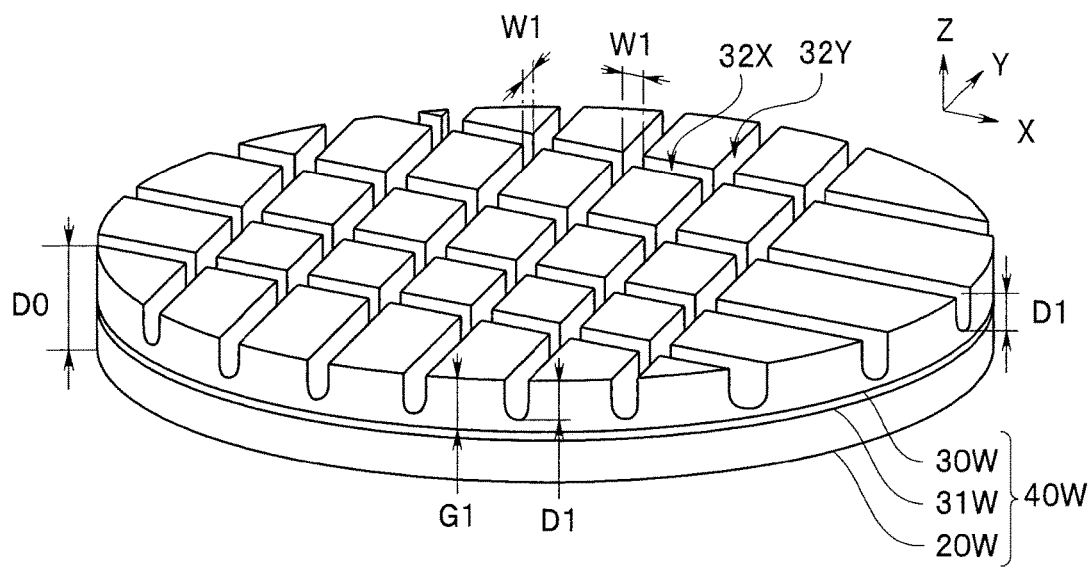
FIG. 7 is a perspective view for describing the method for manufacturing the image pickup chip of the image pickup unit according to the first embodiment.
Figure 8:
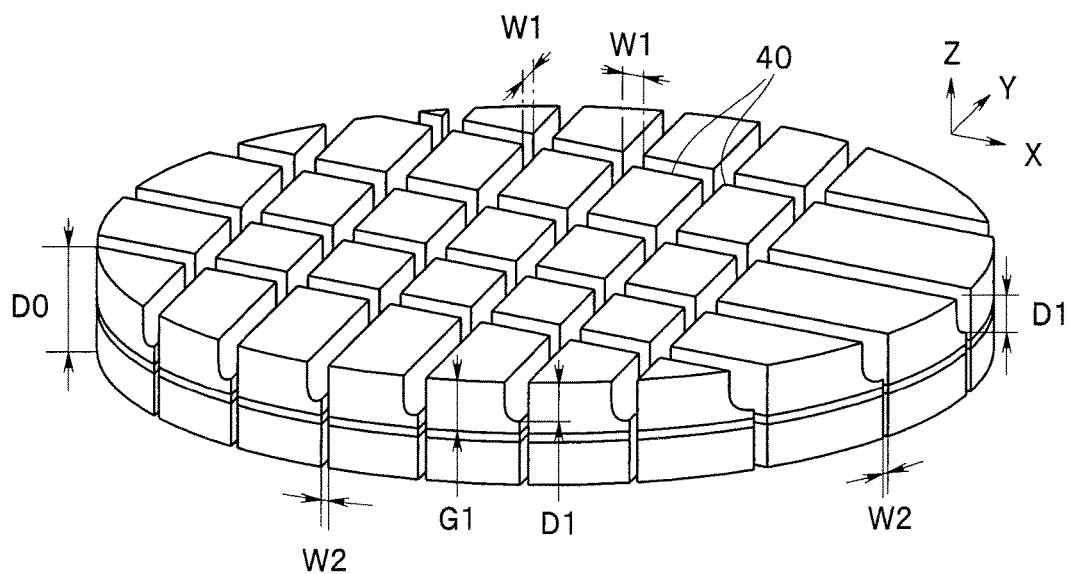
FIG. 8 is a perspective view for describing the method for manufacturing the image pickup chip of the image pickup unit according to the first embodiment.

A method for manufacturing the image pickup unit 10 is described below using FIGS. 6A to 6D; FIG. 7, FIG. 8, and FIG. 9.

Figure 6A:
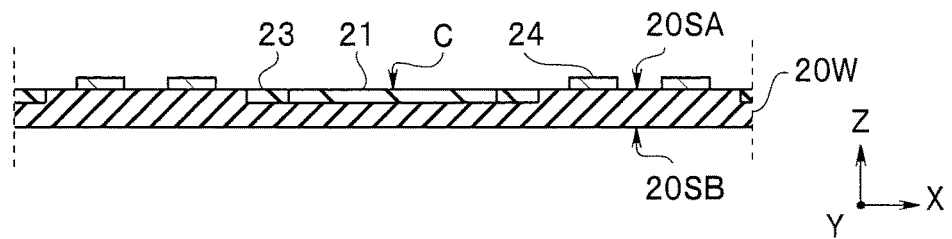
FIG. 6A is a partial cross section view for describing a method for manufacturing an image pickup chip of the image pickup unit according to the first embodiment.

<Step of Producing an Image Pickup Device Wafer> FIG. 6A

An image pickup device wafer 20W is produced which is composed of silicon having a first principal plane 20SA on which a plurality of the light receiving portions 21 is formed and a second principal plane 20SB opposing the first principal plane 20SA. That is, as described later, a plurality of chip-size-package image pickup device chips 20 is produced from one image pickup device wafer 20W.

The light receiving portion 21 is a CCD image sensor or a CMOS image sensor or the like. The peripheral circuit portion 23 is electrically connected with the electrode pads 24 made of aluminum or the like via a surface wiring (not shown). The micro lens array made of a micro lens and the color filter which correspond to each of pixels are provided on the light receiving portion 21. Note that a part of the surface wiring may be used as the electrode pad 24.

Figure 6B:
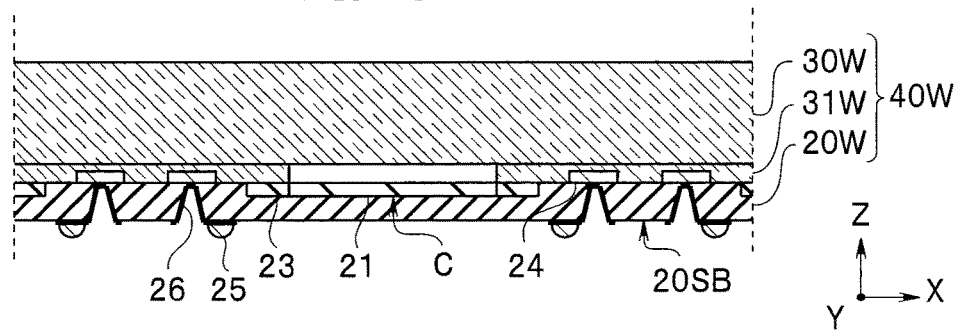
FIG. 6B is a partial cross section view for describing the method for manufacturing the image pickup chip of the image pickup unit according to the first embodiment.

<Junction Wafer Producing Step> FIG. 6B

A glass wafer 30W being a transparent wafer is joined to the first principal plane 20SA of the image pickup device wafer 20W via an adhesive member 31W to produce a junction wafer 40W. The glass wafer 30W is approximately equal to the image pickup device wafer 20W in the plan view dimensions. Note that the transparent wafer is not limited to the glass wafer 30W and has only to be a flat plate made of a material with a transmittance of 90% or higher in a wavelength range of light picked up by the light receiving portion 21. That is, the term "transparence" means that the absorption of light is small in terms of a spectral sensitivity characteristic of a solid image pickup device and does not necessarily mean transparence in terms of visual sense of human.

As shown in FIG. 3 and FIG. 6B, the adhesive member 31W is not provided at least on the upper portion of an effective image pickup area of the light receiving portion 21 to form a hermetic seal portion (a cavity) is formed. However, the adhesion layer 31 may be formed also above the light receiving portion 21 depending on the specifications of the image pickup unit 10.

A through hole passing through the image pickup device wafer 20W immediately under the electrode pads 24 of the junction wafer 40 is formed by etching from the side of the second principal plane 20SB. The through hole can be easily formed by wet etching of alkali solution such as KOH or TMAH, for example. The through hole may be formed by dry etching such as ICP-RIE.

The through wiring 26 is formed inside the through hole and the external electrode portion 25 is formed on the through wiring 26 of the second principal plane 20SB. The external electrode portion 25 is made of gold bump or solder ball used for electrically connecting the external electrode portion 25 with the outside.

Figure 6C:
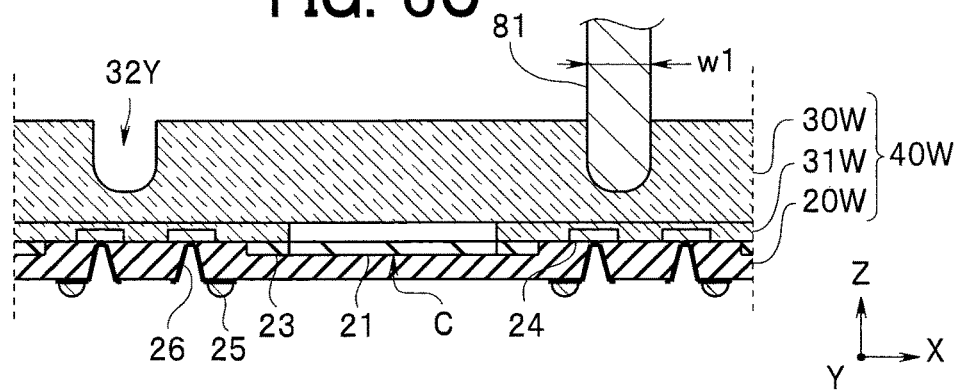
FIG. 6C is a partial cross section view for describing the method for manufacturing the image pickup chip of the image pickup unit according to the first embodiment.

<Groove Forming Step> FIG. 6C and FIG. 7

As shown in FIG. 6C and FIG. 7, a plurality of grooves 32X and 32Y which are orthogonal to each other is formed on the glass wafer 30W of the junction wafer 40W by a blade dicing method using a dicing blade 81.

The formation of the groove by using the blade dicing method being machine work is excellent in workability because a groove with a desired depth can be collectively formed. The width W1 of the grooves 32X and 32Y, in other words, a cutting margin W1 is somewhat larger than the thickness w1 of the dicing blade 81.

The depth D1 of the grooves 32X and 32Y has only to be ½ to ⅘ of the thickness G1 of the glass wafer 30W. For example, if the thickness G1 of the glass wafer 30W is 500 μm, the depth D1 of the grooves 32X and 32Y has only to be 250 μm to 400 μm.

The position of the grooves 32X and 32Y is set with respect to the position of a plurality of the light receiving portions 21 of the junction wafer 40W. Note that parts of the grooves 32X and 32Y correspond to the locking portions 33X and 33Y at the peripheral surface of the image pickup chip 40 respectively after segment.

Figure 6D:
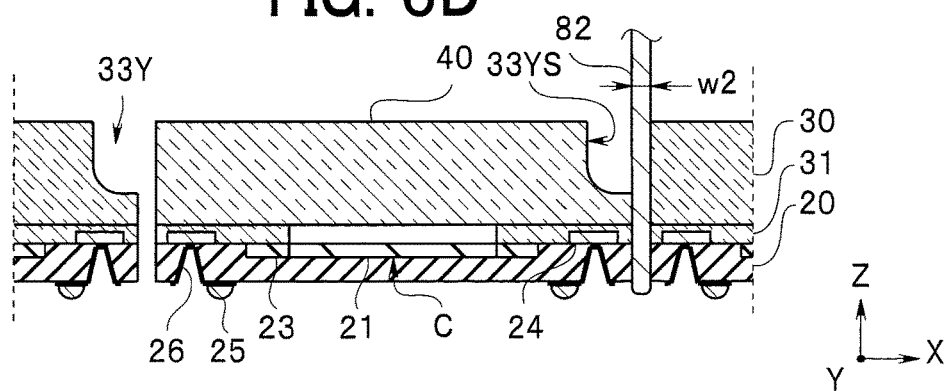
FIG. 6D is a partial cross section view for describing the method for manufacturing the image pickup chip of the image pickup unit according to the first embodiment.

<Segmentation Step> FIG. 6D and FIG. 8

As shown in FIG. 6D and FIG. 8, the junction wafer 40W is cut along the grooves 32X and 32Y with a cutting margin W2 smaller than the cutting margin W1 such that one wall surface is overlapped with a cut face. At the same time when the junction wafer 40W is cut and segmented, the image pickup chip 40 is produced on which the locking portions 33X and 33Y provided with the locking faces 33XS and 33YS are formed respectively on the peripheral surfaces of two sides adjacent and orthogonal to each other. The locking faces 33XS and 33YS are perpendicular to the light receiving portion 21.

That is, the groove reaching a depth that is equal to or greater than a depth D0 of the junction wafer 40W is formed in the junction wafer 40W by the blade dicing method using a dicing blade 82. The width W2 of the groove, in other words, a cutting margin W2 is somewhat larger than the thickness w2 of the dicing blade 82.

Note that if the groove with the cutting margin W2 is along the grooves 32X and 32Y with the cutting margin W1, one wall surface and the cut face of the grooves 32X and 32Y with the cutting margin W1 are not accurately overlapped with each other, so that a slight error in a cut position is allowed.

<Junction Steps>

As shown in FIGS. 9A to 9D, the separately produced outer cylinder portion 50 of the separately produced lens unit 70 aligned with the segmented image pickup chip 40 is joined to the segmented image pickup chip 40 by using adhesive or others. The cylinder part of the inner cylinder portion 60 and the outer cylinder portion 50 are made of metal, resin, or the like and produced by molding using a mold or cutting work into a predetermined shape. Note that the lens unit 70 may be joined to the image pickup chip 40 with the inner cylinder portion 60 inserted into the outer cylinder portion 50.

<Junction Step 1> FIGS. 9A and 9B

First, the lens unit 70 and the image pickup chip 40 are arranged so that the lower face of the lens unit 70 abuts on the upper face of the image pickup chip 40. At this point, the center C of the light receiving portion 21 of the image pickup device chip 20 deviates from the optical axis O of the lens unit 70 in position. That is, the locked faces 51XS and 51YS of the lens unit 70 are apart from the locking faces 33XS and 33YS of the image pickup chip 40.

<Junction Step 2> FIG. 9C

The lens unit 70 is moved only in the X-axis direction so that the locked face 51XS of the lens unit 70 abuts on the locking face 33XS of the image pickup chip 40 with the lower face of the lens unit 70 abutting on the upper face of the image pickup chip 40, that is, with the Z-axis direction fixed. Needless to say, the image pickup chip 40 may be moved instead of the lens unit 70. This operation aligns the center C of the light receiving portion 21 of the image pickup device chip 20 with the optical axis O of the lens unit 70 in the X-axis position.

<Junction Step 3> FIG. 9D

The lens unit 70 is moved in the Y-axis direction so that the locked face 51YS of the lens unit 70 abuts on the locking face 33YS of the image pickup chip 40 with the Z- and X-axis directions fixed. Needless to say, the image pickup chip 40 may be moved instead of the lens unit 70. This operation aligns the center C of the light receiving portion 21 of the image pickup device chip 20 with the optical axis O of the lens unit 70 in the Y-axis position. Under this condition, the lens unit 70 is joined to the image pickup chip 40 by adhesive or others (not shown).

A separately produced inner cylinder portion 60 is inserted into the outer cylinder portion 50 of the lens unit 70 and joined thereto by adhesive or the like (not shown) after a position in the Z-axis direction of the inner cylinder portion 60 is adjusted.

Note that an ultraviolet curing resin, for example, is used for the junction using the adhesive and a concave portion for receiving and holding a surplus resin sticking out from a bonding surface may be formed on any of the members.

In the method for manufacturing the image pickup unit 10, the lens unit 70 is moved in a sliding manner in one direction with one locked face 51YS abutting on one locking face 33YS so that the other locked face 51XS abuts on the other locking face 33XS in a step of joining the lens unit 70 to the image pickup chip 40, to thereby align the center C of the light receiving portion 21 of the image pickup chip 40 with the optical axis O of the lens unit 70.

As described above, in the conventional image pickup unit which needs to be assembled such that the lens barrel 150 covers all of four sides of the image pickup chip 140 with no space, the two dimensional (the X axis and the Y axis) alignment is performed at the same time. In the image pickup unit 10, on the other hand, alignment in the X- and Y-axis directions can be separately performed when the two dimensional (the X axis and the Y axis) alignment is performed.

The image pickup unit 10 is easy in assembly work and small in the plan view dimensions. For this reason, the diameter of an endoscope with the distal end of which the image pickup unit 10 is provided can be reduced. The method for manufacturing the image pickup unit 10 can reduce the plan view dimensions of the image pickup unit 10 and is easy in assembly work.

Note that the locked portions 51X and 51Y of the lens unit 70 may be one locked portion in L-shape in which the locked portions 51X and 51Y are connected together. In this case, the locking portions 33X and 33Y at the peripheral surface of the image pickup chip 40 can be formed as one locking portion in L-shape in which the locking portions 33X and 33Y are connected together.

The locking portions 33X and 33Y at the periphery of the image pickup chip 40 are one locking portion in L-shape in which both of the locking portions 33X and 33Y are connected together, however, the locking portions 33X and 33Y may be two completely separated grooves. The two separated grooves can be formed by etching, for example.

As described above, in the image pickup unit 10, one or two locking portions have only to be formed on the transparent substrate 30 and one or two locked portions of the lens unit 70 have only to abut on the corresponding locking portions.

<Second Embodiment>

An image pickup unit 10A and a method for manufacturing the image pickup unit 10A according to the second embodiment are described below. Since the image pickup unit 10A is similar to the image pickup unit 10, similar components are given the same reference numerals, so that the description thereof is omitted.

Figure 10:
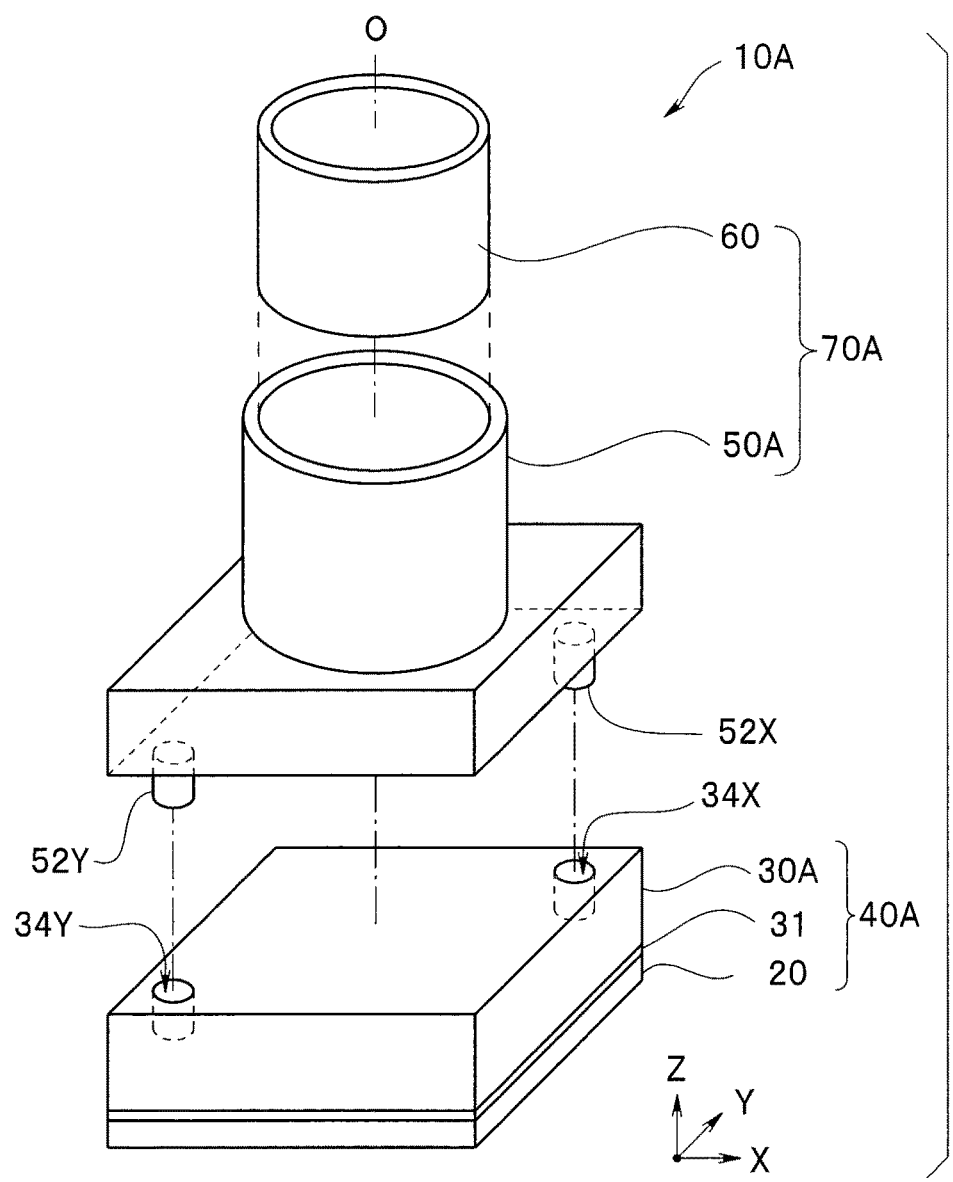
FIG. 10 is an exploded perspective view of an image pickup unit according to a second embodiment.

As shown in FIG. 10, in the image pickup unit 10A, two locking portions of a transparent substrate 30A of an image pickup chip 40A are two concave portions 34X and 34Y formed in the periphery of the image pickup chip 40A. On the other hand, two locked portions on the lower face of an outer cylinder portion 50A of a lens unit 70A are two cylindrical convex portions 52X and 52Y fitted into the two concave portions 34X and 34Y respectively.

The concave portions 34X and 34Y are circular in cross section and slightly larger than the convex portions 52X and 52Y in diameter. The height of the convex portions 52X and 52Y has only to be less than the depth of the concave portions 34X and 34Y. If the depth of the concave portions 34X and 34Y is 300 μm, for example, the height of the convex portions 52X and 52Y has only to be less than 300 μm. Note that if the bottom face of the concave portions 34X and 34Y is in a hemispherical shape with a diameter of 10 μm, the height of the convex portions 52X and 52Y is less than 290 μm.

The concave portions 34X and 34Y are formed by an etching method or a sand blast method via a mask pattern in a state of the junction wafer 40W. A large number of concave portions can be formed at the same time via the mask pattern.

The concave portions 34X and 34Y are formed in a predetermined position with respect to the positions of their respective light receiving portions 21. The depth of the concave portions 34X and 34Y has only to be ½ to ⅘ of the thickness of the glass wafer 30W. Needless to say, the concave portions 34X and 34Y are formed at least outside an effective pixel area of the light receiving portion 21.

Note that the convex portions 52X and 52Y may be in a substantially cone shape, that is, the distal end thereof is smaller than the bottom thereof in diameter and is flat, for example, instead of in a cylindrical shape. The convex portions 52X and 52Y which are in a substantially cone shape are easy to insert into the concave portions 34X and 34Y respectively.

The convex portion 52X may be different from the convex portion 52Y in length. The concave portion 34X may be different from the concave portion 34Y in depth. For example, with a part of the convex portion 52X longer than the convex portion 52Y inserted into the concave portion 34X, the lens unit 70A is rotated with the convex portion 52X as a fulcrum to allow the convex portion 52Y to be aligned with the concave portion 34Y.

That is, the convex portion 52X is fitted into the concave portion 34X at the time of two-dimensional (the X axis and the Y axis) alignment, so that the alignment can be performed in a state where movement is made only in a circumferential direction.

As described above, in the image pickup unit 10A, the locking portion and the locked portion are circular in cross section and two locking portions and two locked portions are provided thereon.

The image pickup unit 10A and the method for manufacturing the image pickup unit 10A have the effect of the image pickup unit 10 and the method for manufacturing the image pickup unit 10.

<Third Embodiment>

An image pickup unit 10B and a method for manufacturing the image pickup unit 10B according to the third embodiment are described below. Since the image pickup unit 10B is similar to the image pickup unit 10A, similar components are given the same reference numerals, so that the description thereof is omitted.

Figure 11:
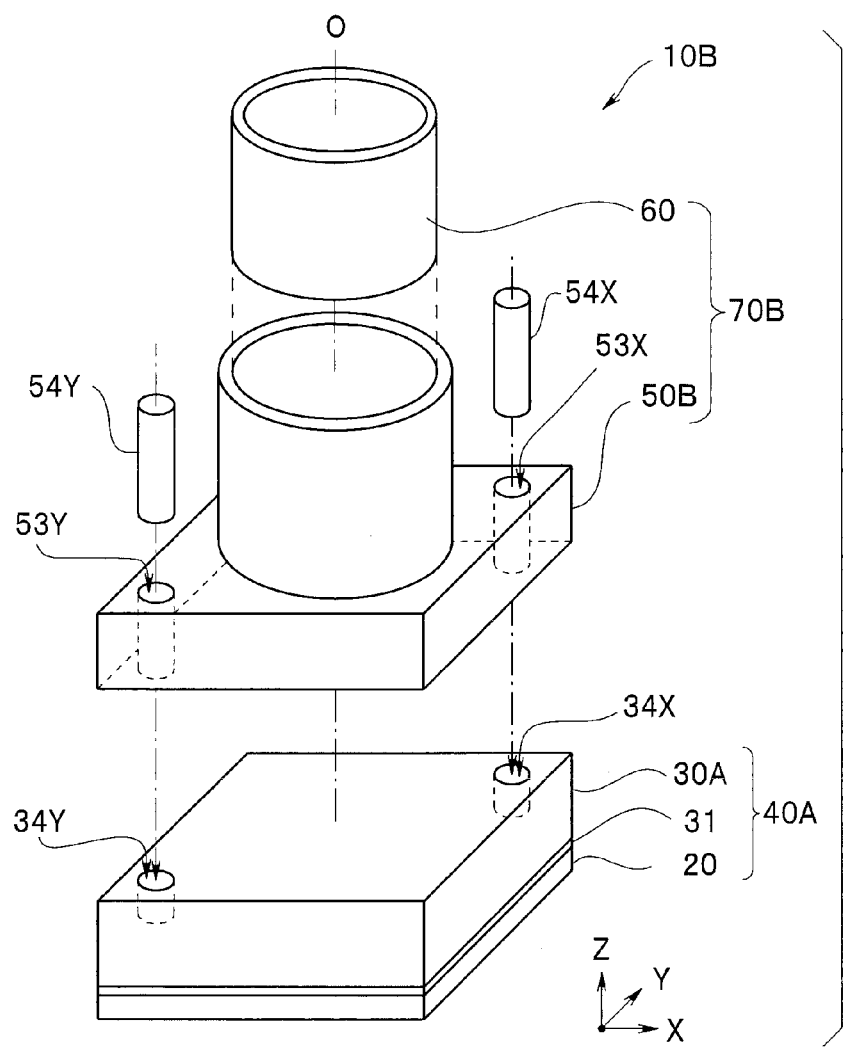
FIG. 11 is an exploded perspective view of an image pickup unit according to a third embodiment.

As shown in FIG. 11, in the image pickup unit 10B, two locked portions are pins being locked members 54X and 54Y which are inserted into through holes 53X and 53Y of an outer cylinder portion 50B of a lens unit 70B and parts of which protrude from the lower face of the lens unit 70B. The locked members 54X and 54Y are circular in cross section and slightly smaller than the through holes 53X and 53Y and the concave portions 34X and 34Y in diameter.

In the method for manufacturing the image pickup unit 10B, the locked members 54X and 54Y are inserted into the concave portions 34X and 34Y through the through holes 53X and 53Y with the through holes 53X and 53Y of the lens unit 70B aligned with the concave portions 34X and 34Y of the image pickup chip 40A respectively.

Note that any one of the locked portions may be a pin inserted into the through hole of the lens unit 70B and the other locked portion may be the convex portion, on the lower face of the lens unit. That is, at least one locked portion has only to be a locked member inserted into the through hole of the lens unit 70B.

The image pickup unit 10B and the method for manufacturing the image pickup unit 10B have the effect of the image pickup unit 10A and the method for manufacturing the image pickup unit 10A and the lens unit is easy to produce.

<Fourth Embodiment>

An image pickup unit 10C and a method for manufacturing the image pickup unit 10C according to the fourth embodiment are described below. Since the image pickup unit 10C is similar to the image pickup unit 10A, similar components are given the same reference numerals, so that the description thereof is omitted.

Figure 12:
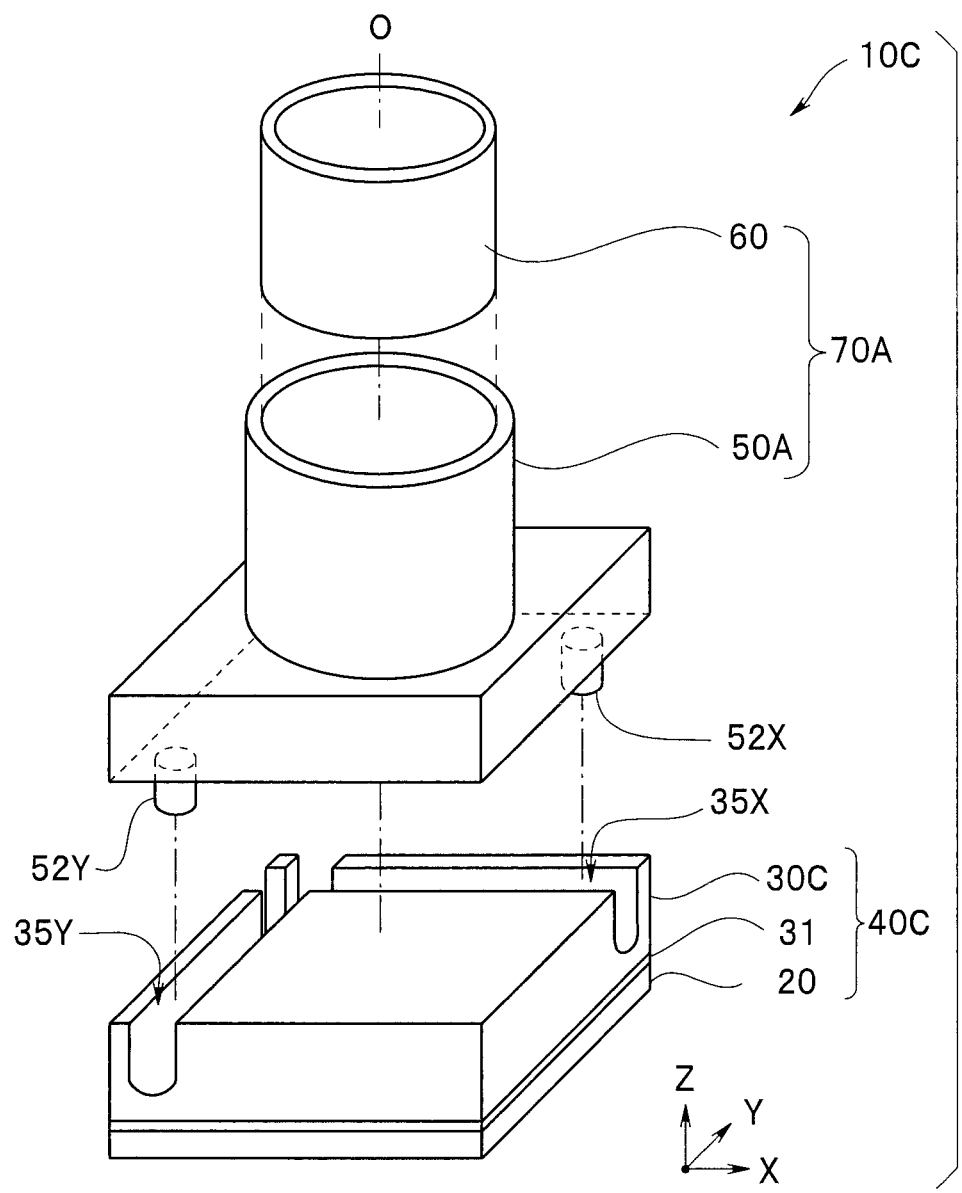
FIG. 12 is an exploded perspective view of an image pickup unit according to a fourth embodiment.

As shown in FIG. 12, in the image pickup unit 10C, two locking portions of a transparent substrate 30C of an image pickup chip 40C are two orthogonal grooves 35X and 35Y formed at the periphery. The grooves 35X and 35Y are formed by a dicing method, the etching method, the sand blast method, or the like in a state of the junction wafer 40W.

Note that the two grooves 35X and 35Y may be of L-shape without intersecting with each other or does not necessarily need to be connected to each other.

In the image pickup unit 10C, the convex portions 52X and 52Y of the lens unit 70A are fitted into their respective corresponding grooves 35X and 35Y to align the center C of the light receiving portion 21 of the image pickup device chip 20C with the optical axis O of the lens unit 70A.

The image pickup unit 10C and the method for manufacturing the image pickup unit 10C have the effect of the image pickup unit 10A and the method for manufacturing the image pickup unit 10A and it is easier to form the locking portion in the image pickup chip 40C.

<Fifth Embodiment>

An image pickup unit 10D and a method for manufacturing the image pickup unit 10D according to the fifth embodiment are described below. Since the image pickup unit 10D is similar to the image pickup unit 10, similar components are given the same reference numerals, so that the description thereof is omitted.

Figure 13:
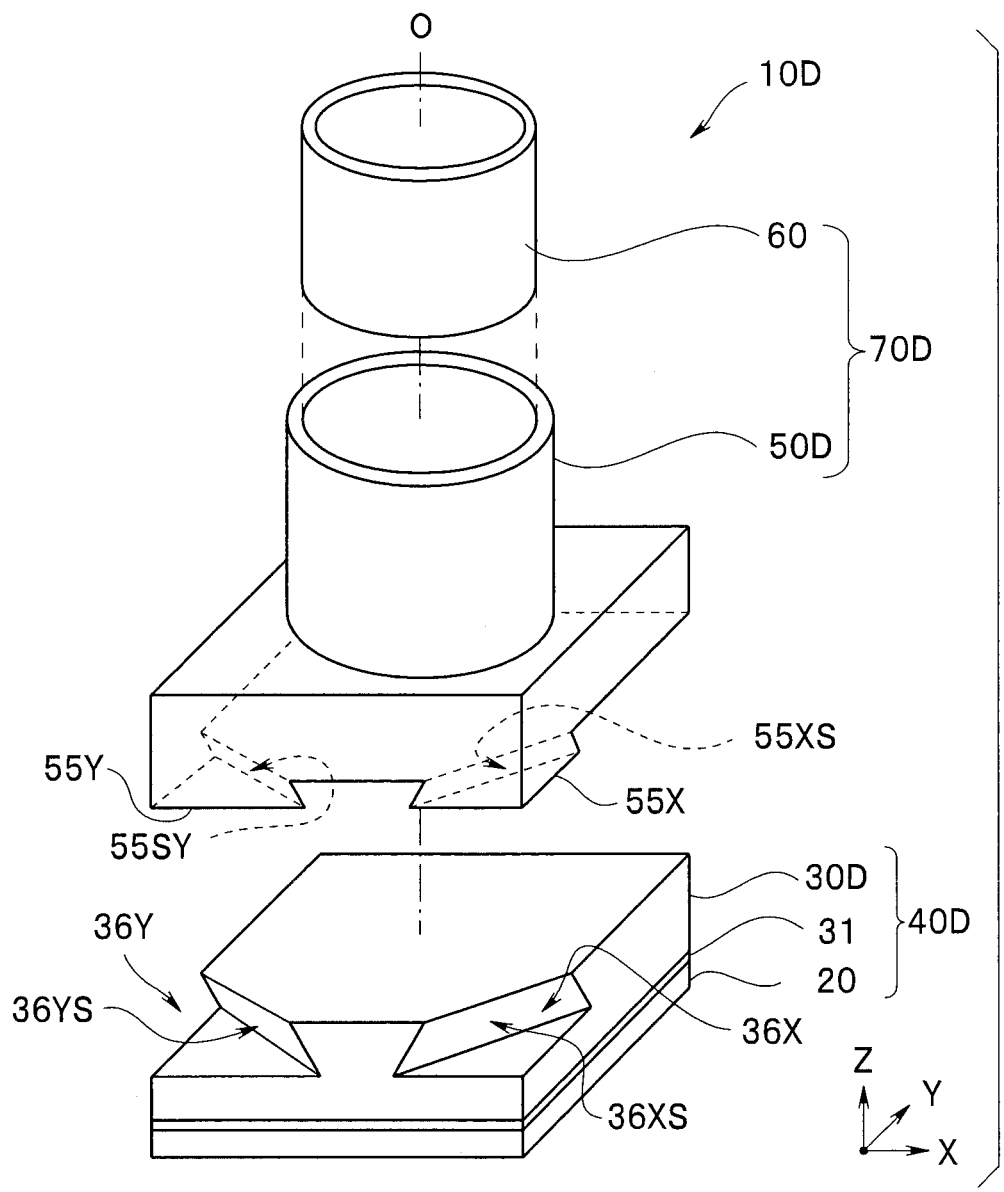
FIG. 13 is an exploded perspective view of an image pickup unit according to a fifth embodiment.

As shown in FIG. 13, in the image pickup unit 10D, locking faces 36XS and 36YS of locking portions 36X and 36Y of a transparent substrate 30D of an image pickup chip 40D are not parallel to the periphery and are not perpendicular faces but are tilted faces which are tilted downward and orthogonal to each other. Similarly, locked faces 55XS and 55YS of locked portions 55X and 55Y of an outer cylinder portion 50D of a lens unit 70D are also not parallel to the periphery and are tilted faces which are tilted downward and orthogonal to each other.

The locking faces 36XS and 36YS and the locked faces 55XS and 55YS are designed to abut on each other. In the image pickup unit 10D, the lens unit 70D can be easily moved while being slid with one locking face 36XS abutting on one locked face 55XS. That is, in the image pickup unit 10D, the center C of the light receiving portion 21 of an image pickup device chip 20D can be easily aligned with the optical axis O of the lens unit 70D.

The image pickup unit 10D and the method for manufacturing the image pickup unit 10D have the effect of the image pickup unit 10 and the method for manufacturing the image pickup unit 10, and further it is easy to perform assembly.

<Sixth Embodiment>

An image pickup unit 10E and a method for manufacturing the image pickup unit 10E according to the sixth embodiment are described below. Since the image pickup unit 10E is similar to the image pickup unit 10, similar components are given the same reference numerals, so that the description thereof is omitted.

Figure 14:
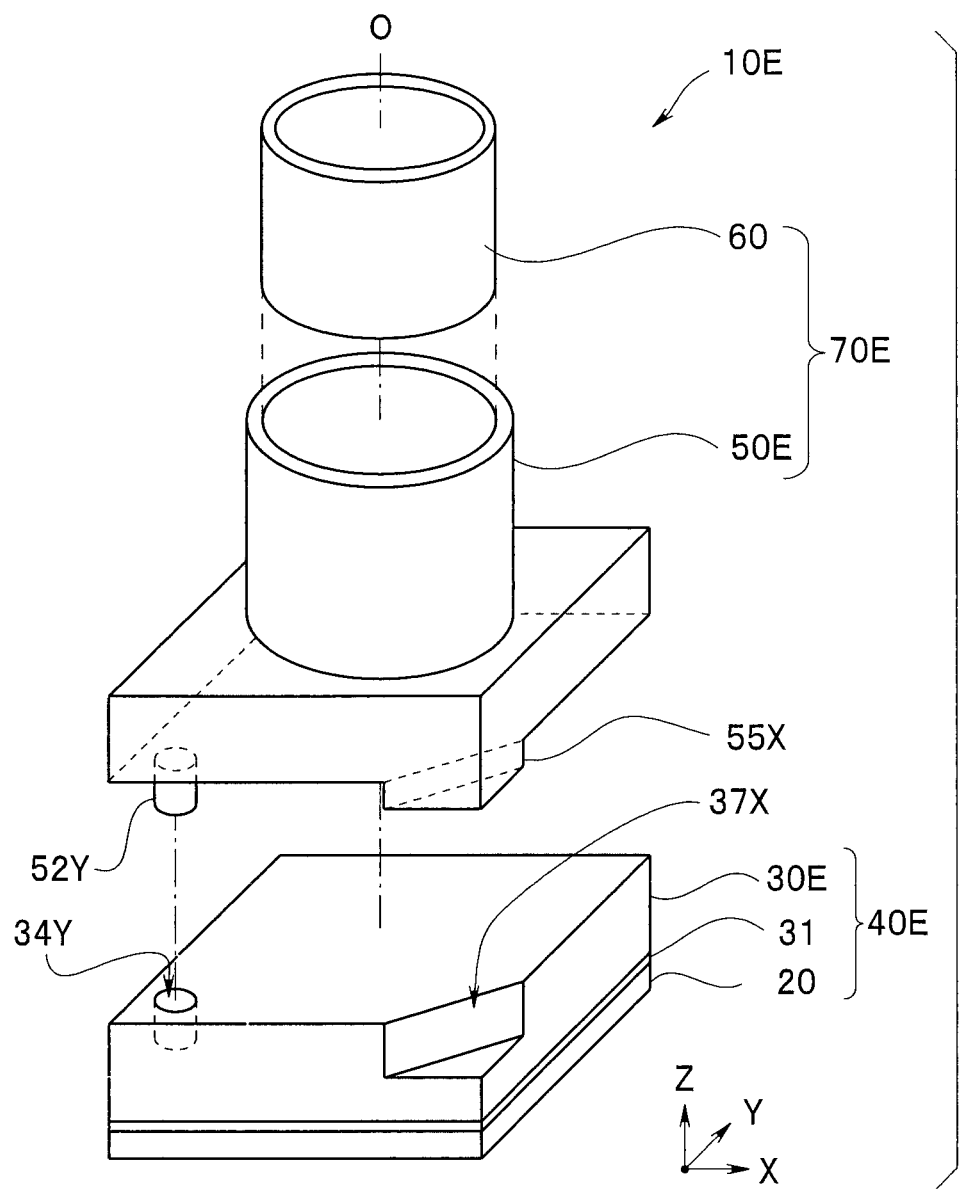
FIG. 14 is an exploded perspective view of an image pickup unit according to a sixth embodiment.

As shown in FIG. 14, in the image pickup unit 10E, one of two locking portions of a transparent substrate 30E is a locking portion 37X with a perpendicular locking face formed on the peripheral surface and the other locking portion is a concave portion 34Y formed on the peripheral portion. One locked portion 55X of two locked portions of an outer cylinder portion 50E of a lens unit 70E has a locked face abutting on the locked face of the locking portion 37X and the other locked portion is a convex portion 52Y fitted into the concave portion 34Y.

In the image pickup unit 10E, the lens unit 70E is rotationally moved such that the locking face abuts on the locked face with the convex portion 52Y fitted into the concave portion 34Y in the junction step, to thereby align the center of the light receiving portion 21 of the image pickup chip 40E with the optical axis of the lens unit 70E.

The image pickup unit 10E and the method for manufacturing the image pickup unit 10E have the effect of the image pickup unit 10 and the method for manufacturing the image pickup unit 10, and further it is easy to perform alignment.

<Seventh Embodiment>

An image pickup unit 10F and a method for manufacturing the image pickup unit 10F according to the seventh embodiment are described below. Since the image pickup unit 10F is similar to the image pickup unit 10A, similar components are given the same reference numerals, so that the description thereof is omitted.

Figure 15:
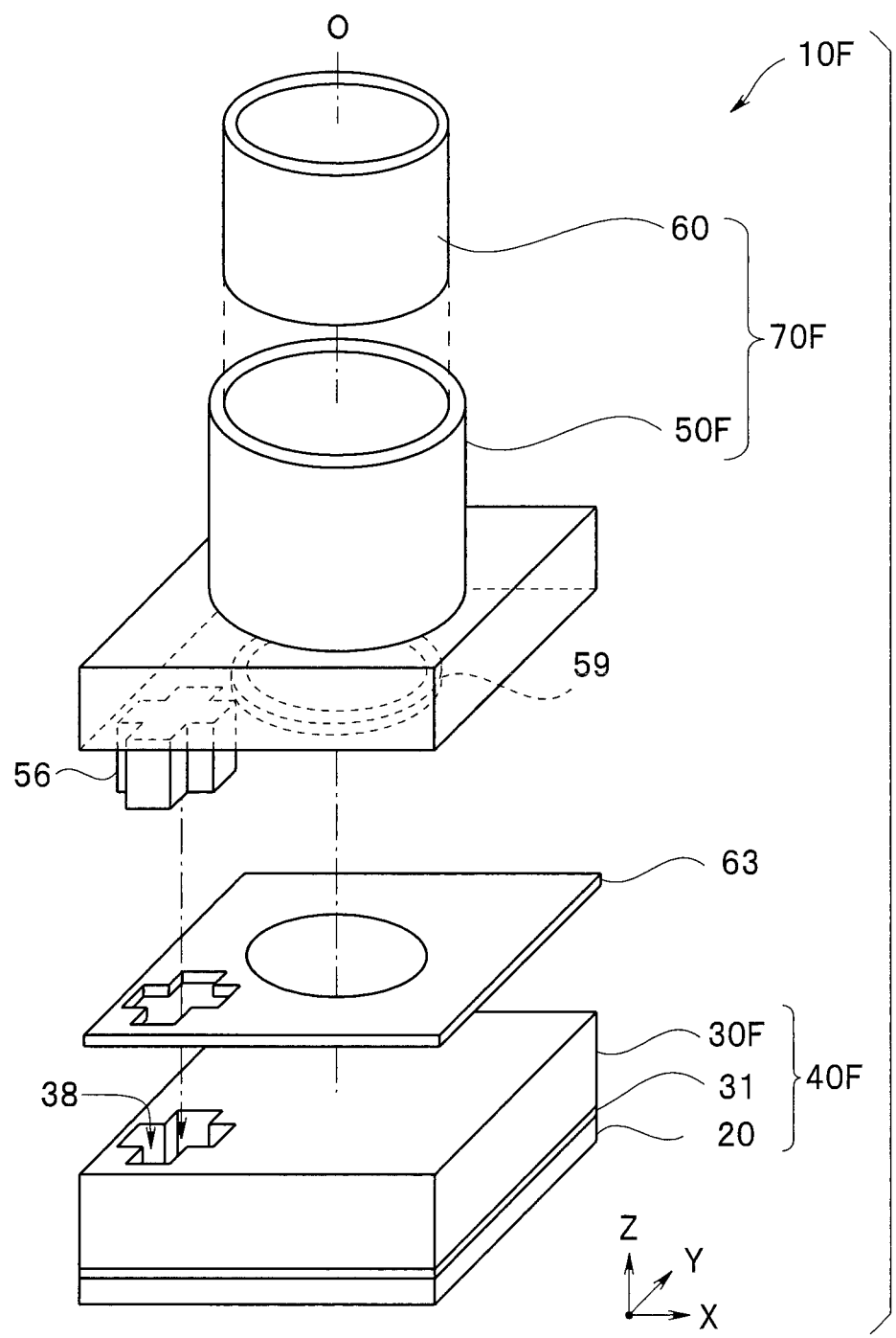
FIG. 15 is an exploded perspective view of an image pickup unit according to a seventh embodiment.

As shown in FIG. 15, in the image pickup unit 10F, a locking portion of a transparent substrate 30F of an image pickup chip 40F is one concave portion 38 formed on the peripheral portion and a locked portion on the lower face of an outer cylinder portion 50F of a lens unit 70F is a convex portion 56 fitted into the concave portion 38.

The locking and locked portions of the image pickup unit 10F are not circular, but of a cross shape in cross section, unlike the image pickup unit 10A. For this reason, in the image pickup unit 10F, the center C of the light receiving portion 21 can be aligned with the optical axis O of the lens unit 70F in the X and Y directions by a pair of the locking portion (the concave portion 38) and the locked portion (the convex portion 56).

Note that the locking and locked portions are not limited to the cross shape in cross section, as long as the portions are not circular, the center C of the light receiving portion 21 can be aligned with the optical axis O of the lens unit 70F in the X and Y directions by the pair of the locking portion and the locked portion. That is, the locking and locked portions may be square, rectangular, elliptical, or triangular in cross section.

The image pickup unit 10F and the method for manufacturing the image pickup unit 10F have the effect of the image pickup unit 10A and the method for manufacturing the image pickup unit 10A, the number of assembly steps can be reduced because only the pair of the locking portion and the locked portion is required, and the plan view dimensions can be decreased.

Note that as shown in FIG. 15, a convex portion 59 lower than the convex portion 56 in height is formed on the lower face of the lens unit 70F of the image pickup unit 10F to surround the optical path. This allows the adhesive joining the lens unit 70F to the image pickup chip 40F to be prevented from sticking out into an optical-path area or a large amount of the adhesive to be prevented from leaking into the outside.

A lens unit whose locking and locked portions are not circular in cross section may be provided with two pairs of the locking and locked portions. All the locking portion (the concave portion) and the locked portion (the convex portion) do not necessarily need to be same in cross section but such a combination that one is circular and the other is square may be used, for example.

Figure 16:
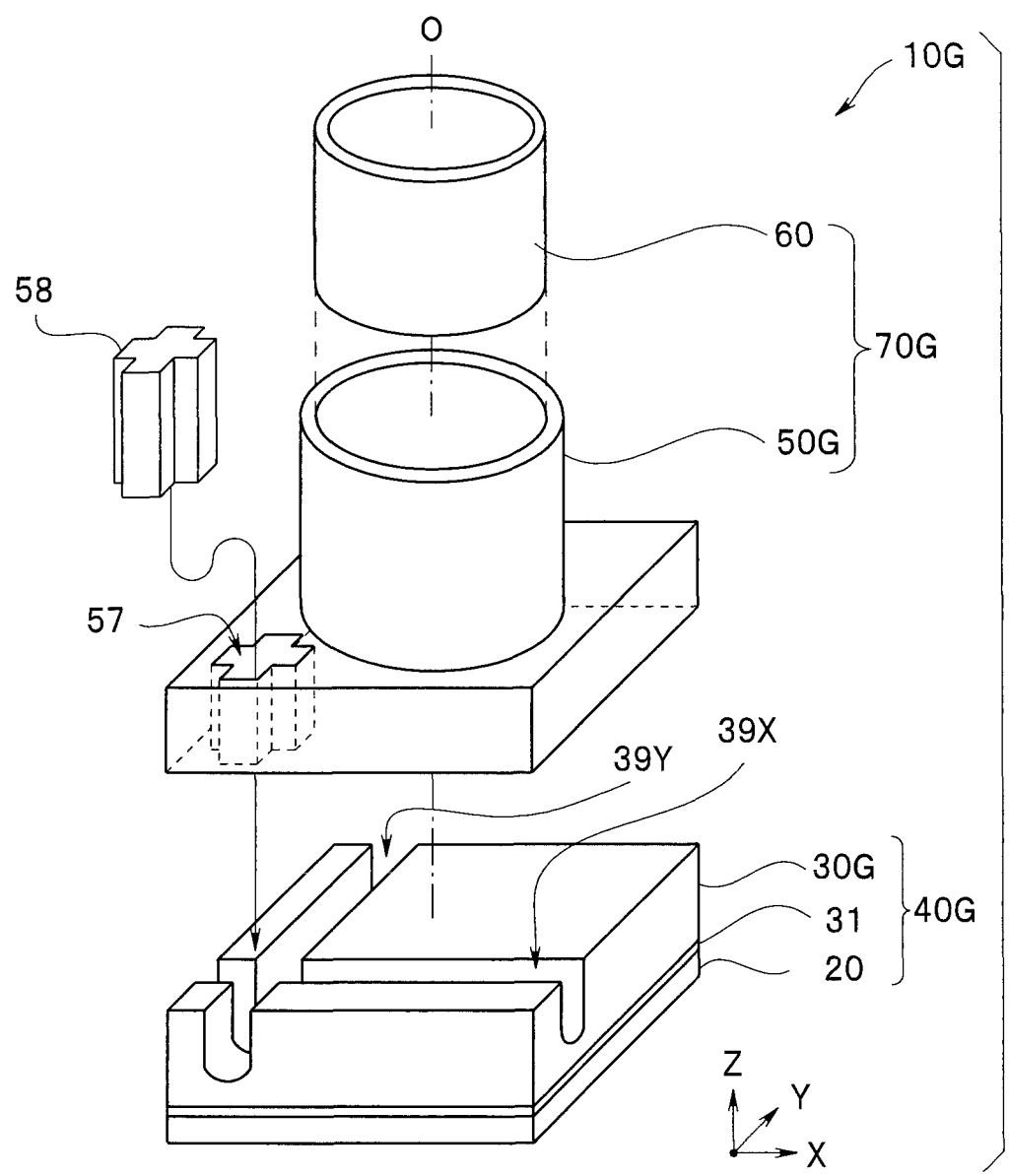
FIG. 16 is an exploded perspective view of an image pickup unit of a modification example according to the seventh embodiment.

As is the case with the image pickup unit 10G, two grooves 39X and 39Y intersecting with each other are formed in an image pickup chip 40G of an image pickup unit 10G being a modification example according to the seventh embodiment shown in FIG. 16. The image pickup unit 10G uses an intersection portion between the two grooves 39X and 39Y as a locking portion (a concave portion). In the image pickup unit 10G, as is the case with the image pickup unit 10B, a locked portion 58 is of a cross shape in cross section and is inserted into a through hole 57 of an outer cylinder portion 50G of a lens unit 70G and a part of the locked portion 58 is protruded from the lower face of the lens unit 70G.

The image pickup unit 10G and the method for manufacturing the image pickup unit 10G have the effect of the image pickup unit 10A and the method for manufacturing the image pickup unit 10A and also have the effect of the image pickup units 10B, 10C, and 10F and the methods for manufacturing the image pickup unit 10B, 10C, and 10F.

The present invention is not limited to the embodiments described above and various changes and modifications can be made without changing the spirit of the present invention.

What is claimed is:

1. An image pickup unit comprising:
an image pickup device chip having a rectangular shape in plan view;
a transparent substrate which is equal in plan view dimensions to the image pickup device chip and is joined to the image pickup device chip, the transparent substrate including one or two locking portions formed therein; and
a lens unit joined to the transparent substrate so that an optical axis of the lens unit is aligned with a center of a light receiving portion of the image pickup device chip; wherein
plan view dimensions of the lens unit in a direction of the optical axis are equal to or smaller than plan view dimensions the transparent substrate;
one or two locked portions of the lens unit are fitted into or abut on the corresponding locking portions; and
the one or two locked portions have a height smaller than a depth of the one or two locking portions.

2. The image pickup unit according to claim 1, wherein the lens unit comprises an inner cylinder portion having an optical system and an outer cylinder portion having a hollow portion into which the inner cylinder portion is inserted.

3. The image pickup unit according to claim 2, wherein the one or two locking portions comprises two locking portions and the one or two locked portions comprises two locked portions; wherein the two locking portions of the transparent substrate are formed on adjacent peripheral surfaces and respective locking faces thereof are orthogonal to each other, and
respective locked faces of the two locked portions of the lens unit abut on the corresponding locking faces.

4. The image pickup unit according to claim 2, wherein the one or two locking portions comprises two locking portions where one of the two locking portions of the transparent substrate has a locking face formed on a peripheral surface, the other of the two locking portions is a concave portion formed in a peripheral portion, and
the one or two locked portions comprises two locked portions where one of the two locked portions of the lens unit has a locked face abutting on the locking face, and the other of the two locked portions is a convex portion fitted into the concave portion.

5. The image pickup unit according to claim 1, wherein the one or two locking portions of the transparent substrate are one or two concave portions formed on a peripheral portion, and
the one or two locked portions of the lens unit are one or two convex portions fitted into the corresponding concave portions.

6. The image pickup unit according to claim 5, wherein the one or two locking portions and the one or two locked portions are circular in cross section, and
two of the one or more locking portions and two of the one or more locked portions are provided.

7. The image pickup unit according to claim 6, wherein at least one of the two locked portions is a locked member inserted into a through hole of the lens unit.

8. The image pickup unit according to claim 5, wherein one of the one or two locking portions and one of the one or two locked portions are not circular in cross section, and
the one of the one or two locking portions and the one of the one or two locked portions are fitted together.

9. The image pickup unit according to claim 1, wherein the one or two locking portions comprises two locking portions and the one or two locked portions comprises two locked portions and the two locked portions are two convex portions, and the two locking portions are two orthogonal grooves formed on an upper face of the transparent substrate.

10. The image pickup unit according to claim 1, wherein the one or two locking portions comprises two locking portions and the one or two locked portions comprises two locked portions, the two locking portions formed on adjacent peripheral surfaces of the lens unit comprise locked faces which are tilted downward and orthogonal to each other, and the two locking faces which abut on the two locked faces of the lens unit, are tilted faces which are tilted downward and orthogonal to each other.

11. The image pickup unit according to claim 1, wherein the one or two locking portions of the transparent substrate include a first locking portion having a locking face perpendicularly formed on a peripheral surface, and a second locking portion that is a concave portion formed on a peripheral portion, and the one or two locked portions of the lens unit include a first locked portion having a locked face which abuts on the locking face of the first locking portion, and a second locked portion having a convex portion fitted into the second locking portion.

12. A method for manufacturing an image pickup unit, the method comprising the steps of:

producing an image pickup device wafer on which a plurality of image pickup device chips are formed;

producing a junction wafer by joining a transparent wafer to the image pickup device wafer;

forming one or two locking portions which are in a predetermined positional relationship with each of the image pickup device chips in the transparent wafer of the junction wafer;

cutting the junction wafer to be segmented into a plurality of image pickup device chips; and joining a lens unit to the image pickup device chips with one or two locked portions of the lens unit fitted into or abutting on the corresponding locking portions of the image pickup device chips, wherein the one or two locked portions have a height smaller than a depth of the one or two locking portions.

13. The method for manufacturing the image pickup unit according to claim 12, wherein the one or two locking portions comprises two locking portions and the one or two locked portions comprises two locked portions; wherein in the step of forming the two locking portions, grooves with a first cutting margin are formed, in the step of cutting, the junction wafer is cut along the grooves with a second cutting margin smaller than the first cutting margin to perform segmentation and to simultaneously form the image pickup device chips on which the two locking portions with respective two locking faces are formed on peripheral surfaces of two orthogonal sides, and in the step of joining, the lens unit is moved so that, with one locked face abutting on one the locking faces, the other locked face abuts on the other locking face, to thereby align a center of a light receiving portion of the image pickup device chip with an optical axis of the lens unit.

14. The method for manufacturing the image pickup unit according to claim 12, wherein the one or two locking portions comprises two locking portions and the one or two locked portions comprises two locked portions;

the two locking portions of the transparent wafer are concave portions formed on a peripheral portion, and the two locked portions of the lens unit are convex portions fitted into the corresponding concave portion.

15. The method for manufacturing the image pickup unit according to claim 14, wherein at least one of the two locked portions is a locked member inserted into a through hole of the lens unit.

16. The method for manufacturing the image pickup unit according to claim 12, wherein one of the two locking portions of the transparent substrate is a locking portion with a locking face formed on a peripheral surface, and the other is a concave portion formed in a peripheral portion, one of the two locked portions of the lens unit has a locked face abutting on the locking face, and the other is a convex portion fitted into the concave portion, and in the step of joining, the lens unit is moved so that the locked face abuts on the locking face with the convex portion fitted into the concave portion, to thereby align a center of a light receiving portion of the image pickup device chip with an optical axis of the lens unit.

* * * * *